United States Patent [19]
Yamamichi

[11] Patent Number: 5,703,451
[45] Date of Patent: Dec. 30, 1997

[54] MOTOR DRIVING CIRCUIT

[75] Inventor: Yoshifumi Yamamichi, Kyoto, Japan

[73] Assignee: Rohm Co., Ltd., Kyoto, Japan

[21] Appl. No.: 785,270

[22] Filed: Jan. 21, 1997

[30] Foreign Application Priority Data

Jan. 24, 1996 [JP] Japan ............................ 8-009925

[51] Int. Cl.⁶ ........................ H02H 7/09; H03K 17/16
[52] U.S. Cl. ..................... 318/492; 318/501; 318/519; 388/903; 361/33
[58] Field of Search ..................... 318/368, 379, 318/430, 434, 459, 492, 500, 501, 519; 388/903, 907.2, 928.1; 361/33

[56] References Cited

U.S. PATENT DOCUMENTS

| | | | |
|---|---|---|---|
| 4,249,219 | 2/1981 | Aoi et al. | |
| 5,572,096 | 11/1996 | Schlager | 318/254 |
| 5,576,648 | 11/1996 | Rossi et al. | 327/110 |

*Primary Examiner*—Bentsu Ro
*Attorney, Agent, or Firm*—Nikaido, Marmelstein, Murray & Oram LLP

[57] ABSTRACT

Between one end of a motor coil and the ground, a drive transistor is connected. When the drive transistor is turned off, and in particular at the moment when a current flowing through the motor coil drops to zero, a back electromotive force is induced at said one end of the motor coil. The back electromotive force is clamped by a pnp-type transistor with its base supplied with a constant voltage and its emitter connected to said one end of the motor coil.

3 Claims, 2 Drawing Sheets

MOTOR DRIVING CIRCUIT

BACKGROUND OF THE INVENTION

1. Field of the Invention

The present invention relates to a motor driving circuit.

2. Description of the Prior Art

A full-wave motor is controlled by passing currents through its motor coil alternately in the forward and reverse directions.

In controlling a full-wave motor in such a way, when the direction of the current is switched, in particular at the moment when a current that has hitherto been flowing becomes zero, a high back electromotive force is induced. This back electromotive force can in some cases destroy the motor driving transistors, and therefore it has been customary to additionally connect a diode between each end of the coil and a power line so that the back electromotive force induced in the coil is absorbed through the diodes by the power line.

However, this method requires that the diodes have as large a current capacity as the drive transistors. Accordingly, the use of the diodes inconveniently increases the cost of a motor driving circuit.

Moreover, in this conventional circuit, since the power line is used to absorb all the current resulting from the back electromotive force, the power line suffers from noise, and this adversely affects the operation of a drive circuit that is connected to the power line. Note that the drive circuit here is a circuit for providing signals with which the transistors are turned on and off. Of course, if there are any other circuits (not shown in the figure) that are connected to the power line, those circuits are also affected by the noise on the power line.

SUMMARY OF THE INVENTION

An object of the present invention is to provide a motor driving circuit that can realize a back-electromotive-force-withstanding active device at a relatively low cost and that causes substantially no noise in a power line.

To achieve the above object, according to the present invention, a motor driving circuit is so constructed that a back electromotive force that is induced at one end of a motor coil at a moment when a current flowing through the motor coil drops to zero as a result of turning off of a drive transistor connected between said end of the motor coil and a ground line is clamped by a pnp-type transistor with its base supplied with a fixed voltage and its emitter connected to said end of the motor coil, and that said drive transistor is turned on by a collector current of the pnp-type transistor. As a result, a back electromotive force is limited within a predetermined level, and a current resulting from the back electromotive force is absorbed through the drive transistor by, for example, the ground line. Since a ground line generally has the lowest impedance, no noise is caused.

Moreover, according to the present invention, a motor driving circuit is provided with first and second transistors of an npn type that are connected between a power line and a ground line with their collector-emitter paths connected in series; third and fourth transistors of a npn type that are connected between a power line and a ground line with their collector-emitter paths connected in series; means for controlling said transistors to be either in a first state where the first and fourth transistors are on and the second and third transistors are off or in a second state where the first and fourth transistors are off and the second and third transistors are on; a motor coil connected between a first node connecting an emitter of the first transistor to a collector of the second transistor and a second node connecting an emitter of the third transistor to a collector of the fourth transistor; a fifth transistor of a pnp type with its base connected to said power line, its emitter connected to the first node, and its collector connected to a base of the second transistor; and a sixth transistor of a pnp type with its base connected to said power line, its emitter connected to the second node, and its collector connected to a base of the fourth transistor.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
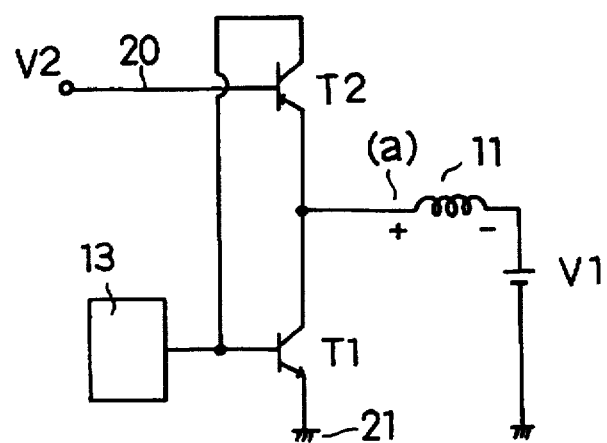
FIG. 1 is a circuit diagram showing a first embodiment of the motor driving circuit of the present invention.

Hereinafter, embodiments of the motor driving circuit of the present invention will be described with reference to the drawings. FIG. 1 shows a first embodiment. Reference numeral 11 represents a motor coil, of which one end is connected to the collector of an npn-type drive transistor T1 and to the emitter of an pnp-type transistor T2, and of which the other end is connected to a direct-current power source V1. Reference numeral 13 represents a drive circuit for controlling the transistor T1. The base of the transistor T2 is connected to a line 20, to which a direct-current voltage V2 is applied. The collector of the transistor T2 is connected to the base of the transistor T1.

Now, suppose that the transistor T1 is on. Then, a current flows through the coil 11 along the path from the direct-current power source V1 to the coil 11, to the transistor T1, and then to the ground. Under this condition, when the transistor T1 is turned off, a high back electromotive force is induced in the coil 11, resulting in a positive phase at one end of the coil, i.e. at point (a), and a negative phase at the other end.

However, the voltage at point (a) is clamped at a level of $(V2+V_{BE})$ by the pnp-type transistor T2. Here, $V_{BE}$ represents the emitter-base voltage of the transistor T2.

Accordingly, the collector current of the transistor T2 flows into the base of the transistor T1, thereby turning the transistor T1 on. As a result, through the transistor T1, a current flows from point (a) to a ground line 21, causing the potential at point (a) to drop abruptly. This turns the transistor T2 off and also turns the transistor T1 off. Here, since the transistor T2 needs to have only a small capacity sufficient to supply the base current of the transistor T1, it can be formed compactly and at low cost. Moreover, since a ground line generally has the lowest impedance, no noise is caused even when a current flows into it.

Figure 2:
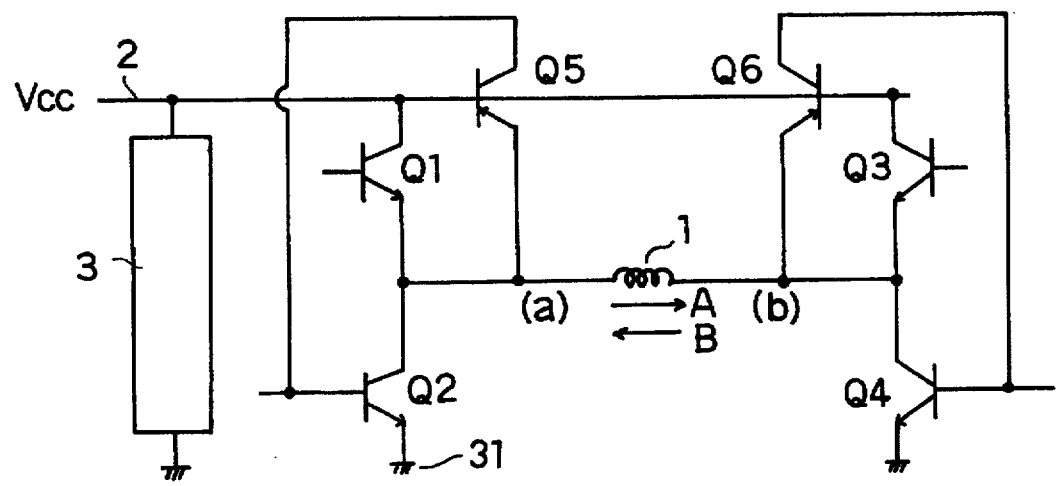
FIG. 2 is a circuit diagram showing a second embodiment of the motor driving circuit of the present invention.

FIG. 2 shows a second embodiment, which is constructed for use with a full-wave motor. In FIG. 2, Q1 to Q4 represent npn-type transistors for driving the motor. One end of the coil 1 of the motor is connected to the emitter of the transistor Q1 and to the collector of the transistor Q2. The other end of the coil 1 is connected to the emitter of the transistor Q3 and to the collector of the transistor Q4. The bases of all the transistors Q1 to Q4 are connected to a drive circuit 3. The emitters of the transistors Q2 and Q4 are connected to a ground line 31. The collectors of the transistors Q1 and Q3 are connected to a power line 2, to which a voltage Vcc is applied. When the drive circuit 3 controls the transistors Q1 and Q4 to be turned on and the transistors Q2 and Q3 to be turned off, a current flows through the coil 1 in direction A. When the drive circuit 3 controls the transistors Q2 and Q3 to be turned on and the transistors Q1 and Q4 to be turned off, a current flows through the coil 1 in direction B. The two ends of the coil 1 are respectively connected to the emitters of pnp-type transistors Q5 and Q6.

The bases of both the transistors Q5 and Q6 are connected to the power line 2. The collector of the transistor Q5 is connected to the base of the transistor Q2, and the collector of the transistor Q6 is connected to the base of the transistor Q4.

Now, suppose that the transistors Q2 and Q3 are currently on, and that, from this state, the direction of the current flowing through the coil 1 is switched from direction B to direction A. At the moment when the transistors Q2 and Q3 are turned off and thus a current that has been flowing in direction B drops to zero, a positive back electromotive force is induced at point (a). This back electromotive force is clamped at a voltage of $(V_{CC}+V_{BE})$ by the transistor Q5. Here, $V_{BE}$ represents the emitter-base voltage of the transistor Q5.

The collector current of the transistor Q5 turns the transistor Q2 on, so that, through the transistor Q2, a current flows from the coil 1 to the ground. This causes the potential at point (a) to drop abruptly to the ground level, thereby turning the transistor Q5 off and also turning the transistor Q2 off. As a result, the transistors Q1 and Q4 are turned on, so that a current is allowed to flow in direction A.

When the current that is now flowing in direction A drops to zero, the pnp-type transistor Q6 is turned on, thereby clamping the potential at point (b) at $(V_{CC}+V_{BE})$ and turning the transistor Q4 on. When the back electromotive force at point (b) has thus been dissipated, the transistors Q6 and Q4 are turned off, so that a current is allowed to flow in direction B.

Figure 3:
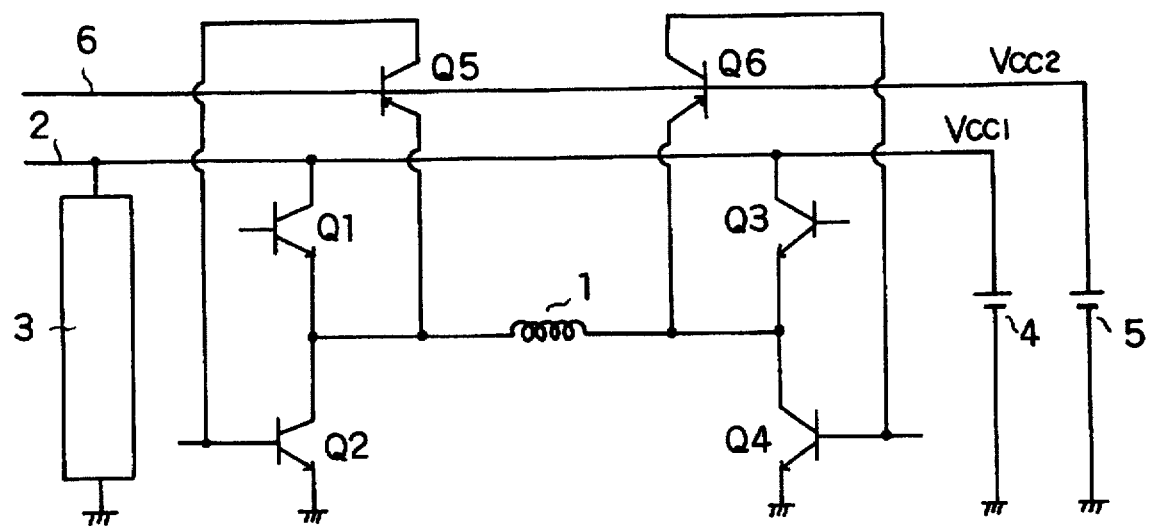
FIG. 3 is a circuit diagram showing a third embodiment of the motor driving circuit of the present invention.

FIG. 3 shows a third embodiment, in which, as compared with the second embodiment shown in FIG. 2, the bases of the transistors Q5 and Q6 are connected in a different way. Specifically, in the third embodiment, in addition to the power line 2, a second power line 6 is provided, and the bases of the transistors Q5 and Q6 are connected to this second power line 6. Reference numerals 4 and 5 respectively represent direct-current power sources for supplying the power lines 2 and 6 with direct-current voltages $V_{CC1}$ and $V_{CC2}$.

In the third embodiment, the provision of the power line 6, which is used exclusively for the voltage-clamping purpose, completely saves the power line 2 from the influence of back electromotive force absorption. Note that it is also possible to connect the base of one of the transistors Q5 and Q6 to the power line 2 and the base of the other to the power line 6.

As described above, according to the present invention, the transistors T2, Q5, and Q6, which should withstand back electromotive forces, need to have only a small capacity. This is advantageous in terms of cost reduction. Moreover, according to the present invention, the power line suffers from substantially no noise resulting from back electromotive forces.

What is claimed is:

1. A motor driving circuit, wherein a back electromotive force that is induced at one end of a motor coil at a moment when a current flowing through the motor coil drops to zero as a result of turning off of a drive transistor connected between said end of the motor coil and a ground line is clamped by a pnp-type transistor with its base supplied with a fixed voltage and its emitter connected to said end of the motor coil, and wherein said drive transistor is turned on by a collector current of the pnp-type transistor.

2. A motor driving circuit comprising:

first and second transistors of an npn type that are connected between a power line and a ground line with their collector-emitter paths connected in series;

third and fourth transistors of a npn type that are connected between a power line and a ground line with their collector-emitter paths connected in series;

means for controlling said transistors to be alternately in a first state where the first and fourth transistors are on and the second and third transistors are off and in a second state where the first and fourth transistors are off and the second and third transistors are on;

a motor coil connected between a first node connecting an emitter of the first transistor to a collector of the second transistor and a second node connecting an emitter of the third transistor to a collector of the fourth transistor;

a fifth transistor of a pnp type with its base connected to said power line, its emitter connected to the first node, and its collector connected to a base of the second transistor; and a sixth transistor of a pnp type with its base connected to said power line, its emitter connected to the second node, and its collector connected to a base of the fourth transistor.

3. A motor driving circuit comprising:

first and second transistors of an npn type that are connected between a first power line and a ground line with their collector-emitter paths connected in series;

third and fourth transistors of a npn type that are connected between the first power line and a ground line with their collector-emitter paths connected in series;

means for controlling said transistors to be alternately in a first state where the first and fourth transistors are on and the second and third transistors are off and in a second state where the first and fourth transistors are off and the second and third transistors are on;

a motor coil connected between a first node connecting an emitter of the first transistor to a collector of the second transistor and a second node connecting an emitter of the third transistor to a collector of the fourth transistor;

a second power line;

a fifth transistor of a pnp type with its base connected to said second power line, its emitter connected to the first node, and its collector connected to a base of the second transistor; and a sixth transistor of a pnp type with its base connected to the second power line, its emitter connected to the second node, and its collector connected to a base of the fourth transistor.

\* \* \* \* \*